(12) United States Patent
He et al.

(10) Patent No.: US 11,063,105 B2
(45) Date of Patent: Jul. 13, 2021

(54) DISPLAY PANEL AND FABRICATION METHOD, AND DISPLAY DEVICE

(71) Applicant: Xiamen Tianma Micro-Electronics Co., Ltd., Xiamen (CN)

(72) Inventors: Shui He, Xiamen (CN); Shaorong Yu, Shanghai (CN); Zhaokeng Cao, Shanghai (CN)

(73) Assignee: XIAMEN TIANMA MICRO-ELECTRONICS CO., LTD., Xiamen (CN)

( * ) Notice: Subject to any disclaimer, the term of this patent is extended or adjusted under 35 U.S.C. 154(b) by 0 days.

(21) Appl. No.: 16/821,317

(22) Filed: Mar. 17, 2020

(65) Prior Publication Data

US 2021/0134915 A1    May 6, 2021

(30) Foreign Application Priority Data

Oct. 31, 2019    (CN) .......................... 201911056030.3

(51) Int. Cl.
*H01L 27/32*    (2006.01)
*H01L 51/00*    (2006.01)
(Continued)

(52) U.S. Cl.
CPC ...... *H01L 27/3265* (2013.01); *H01L 27/3258* (2013.01); *H01L 27/3262* (2013.01);
(Continued)

(58) Field of Classification Search
CPC ............... H01L 27/1225; H01L 27/124; H01L 27/1251; H01L 27/1255; H01L 27/1259; H01L 27/3258; H01L 27/3262; H01L 27/3265; H01L 27/3276; H01L 28/82; H01L 28/90; H01L 29/78675; H01L 29/7869; H01L 51/0097; H01L 2251/5338
See application file for complete search history.

(56) References Cited

U.S. PATENT DOCUMENTS

2016/0268361 A1* 9/2016 Wang ................. H01L 27/3246
2017/0025492 A1   1/2017 Jung et al.
(Continued)

FOREIGN PATENT DOCUMENTS

CN    101826548 A    9/2010
CN    102487071 A    6/2012

*Primary Examiner* — Matthew E Warren
(74) *Attorney, Agent, or Firm* — Anova Law Group PLLC

(57) ABSTRACT

A display panel and fabrication method, and a display device are provided. The display panel includes a base substrate, a first transistor and a storage capacitor. The storage capacitor includes a first electrode and a second electrode, and the first electrode and a gate of the first transistor have an overlapped region. The display panel also includes a first insulating layer having a plurality of first vias in the overlapped region, and the first electrode is electrically connected to the gate of the first transistor through the plurality of first vias. A plurality of grooves are formed on a side of the first electrode facing away from the base substrate. A plurality of protrusions are formed on a side of the second electrode facing toward the base substrate. A groove, a protrusion and a first via overlap in a direction perpendicular to the surface of the base substrate.

16 Claims, 6 Drawing Sheets

(51) Int. Cl.
*H01L 29/786* (2006.01)
*H01L 27/12* (2006.01)
*H01L 49/02* (2006.01)

(52) U.S. Cl.
CPC ...... *H01L 27/3276* (2013.01); *H01L 51/0097*
(2013.01); *H01L 27/124* (2013.01); *H01L
27/1225* (2013.01); *H01L 27/1251* (2013.01);
*H01L 27/1255* (2013.01); *H01L 27/1259*
(2013.01); *H01L 28/82* (2013.01); *H01L
29/7869* (2013.01); *H01L 29/78675* (2013.01);
*H01L 2227/323* (2013.01); *H01L 2251/5338*
(2013.01)

(56) References Cited

U.S. PATENT DOCUMENTS

| | | | |
|---|---|---|---|
| 2018/0203314 A1* | 7/2018 | Sugimoto | H01L 27/1222 |
| 2018/0323342 A1* | 11/2018 | Tsai | H01L 27/1255 |
| 2021/0020724 A1* | 1/2021 | Cho | G09G 3/3275 |
| 2021/0028259 A1* | 1/2021 | Xu | H01L 27/3258 |
| 2021/0074786 A1* | 3/2021 | Jeon | H01L 27/3265 |

* cited by examiner

DISPLAY PANEL AND FABRICATION METHOD, AND DISPLAY DEVICE

CROSS-REFERENCES TO RELATED APPLICATIONS

This application claims the priority of Chinese patent application No. 201911056030.3, filed on Oct. 31, 2019, the entirety of which is incorporated herein by reference.

FIELD

The present disclosure generally relates to the field of display technology and, more particularly, relates to a display panel and fabrication method, and a display device.

BACKGROUND

An electroluminescent display is a self-illuminating display, and achieves real-time display function without using a backlight component. Therefore, the electroluminescent display is featured with advantages such as light weight and portability, etc., and has a substantially wide application potentials.

A display panel in the electroluminescent display often includes a plurality of pixels. Each pixel includes a pixel circuit and a light-emitting unit that are electrically connected to each other. The pixel circuit includes a transistor and a capacitor. A gate of a transistor is often multiplexed as an electrode of the capacitor, and a metal plate disposed between the gate and source/drain of the transistor serves as the other electrode of the capacitor. Because the sizes of two electrodes of the capacitor are often set to be substantially large, when the display panel is bent, an insulating layer between the two electrodes of the capacitor tends to be damaged or the film quality tends to be deteriorated. Thus, the insulation effect of the insulating layer is reduced, which causes a capacitor leakage to generate a leakage current. The leakage current adversely affects a gate potential of the transistor, and then affects the light-emitting brightness of the light-emitting unit, such that a flicker phenomenon occurs in a low-frequency display state, which reduces the display effect.

Therefore, how to eliminate the flicker phenomenon and improve the display effect has become an urgent technical problem to be solved. The disclosed display panel and fabrication method, and display device are directed to solve one or more problems set forth above and other problems.

SUMMARY

One aspect of the present disclosure provides a display panel. The display panel includes a base substrate, and a first transistor and a storage capacitor disposed on the base substrate. The storage capacitor includes a first electrode and a second electrode that are disposed opposite to each other, and the first electrode and a gate of the first transistor have an overlapped region in a direction perpendicular to a surface of the base substrate. The display panel also includes a first insulating layer disposed between the first electrode and the gate of the first transistor. The first insulating layer has a plurality of first vias in the overlapped region, and the first electrode is electrically connected to the gate of the first transistor through the plurality of first vias. The first electrode includes a first side and a second side that are opposite to each other, and the first side is a side of the first electrode facing away from the base substrate. A plurality of grooves are formed on the first side of the first electrode. A plurality of protrusions are formed on a side of the second electrode facing toward the base substrate. A groove of the plurality of grooves, a protrusion of the plurality of protrusions, and a first via of the plurality of first vias overlap in the direction perpendicular to the surface of the base substrate.

Another aspect of the present disclosure provides a display device. The display device includes a display panel. The display panel includes a base substrate, and a first transistor and a storage capacitor disposed on the base substrate. The storage capacitor includes a first electrode and a second electrode that are disposed opposite to each other, and the first electrode and a gate of the first transistor have an overlapped region in a direction perpendicular to a surface of the base substrate. The display panel also includes a first insulating layer disposed between the first electrode and the gate of the first transistor. The first insulating layer has a plurality of first vias in the overlapped region, and the first electrode is electrically connected to the gate of the first transistor through the plurality of first vias. The first electrode includes a first side and a second side that are opposite to each other, and the first side is a side of the first electrode facing away from the base substrate. A plurality of grooves are formed on the first side of the first electrode. A plurality of protrusions are formed on a side of the second electrode facing toward the base substrate. A groove of the plurality of grooves, a protrusion of the plurality of protrusions, and a first via of the plurality of first vias overlap in the direction perpendicular to the surface of the base substrate.

Another aspect of the present disclosure provides a method for forming a display panel. The method includes sequentially forming a gate of a first transistor and a first insulating layer on a base substrate, and forming a plurality of first vias in the first insulating layer. The method also includes sequentially forming a first electrode and a second electrode of a storage capacitor on a surface of the first insulating layer where the plurality of first vias are formed. Further, the method includes forming a plurality of grooves on a side of the first electrode facing away from the base substrate, and forming a plurality of protrusions on a side of the second electrode facing toward the base substrate. The first electrode and the gate of the first transistor have an overlapped region in a direction perpendicular to a surface of the base substrate. The plurality of first vias are disposed in the overlapped region, and the first electrode is electrically connected to the gate of the first transistor through the plurality of first vias. A groove of the plurality of grooves, a protrusion of the plurality of protrusions, and a first via of the plurality of first vias overlap in the direction perpendicular to the surface of the base substrate.

Other aspects of the present disclosure can be understood by those skilled in the art in light of the description, the claims, and the drawings of the present disclosure.

BRIEF DESCRIPTION OF THE DRAWINGS

To more clearly illustrate the embodiments of the present disclosure, the drawings will be briefly described below. The drawings in the following description are certain embodiments of the present disclosure, and other drawings may be obtained by a person of ordinary skill in the art in view of the drawings provided without creative efforts.

DETAILED DESCRIPTION OF THE DISCLOSURE

Reference will now be made in detail to exemplary embodiments of the disclosure, which are illustrated in the accompanying drawings. Wherever possible, the same reference numbers will be used throughout the drawings to refer to the same or the alike parts. The described embodiments are some but not all of the embodiments of the present disclosure. Based on the disclosed embodiments, persons of ordinary skill in the art may derive other embodiments consistent with the present disclosure, all of which are within the scope of the present disclosure.

Similar reference numbers and letters represent similar terms in the following Figures, such that once an item is defined in one Figure, it does not need to be further discussed in subsequent Figures.

Figure 1:
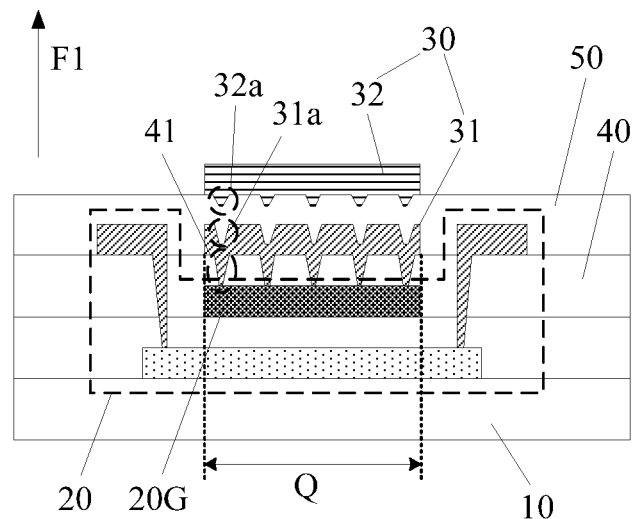
FIG. 1 illustrates a schematic structural diagram of an exemplary display panel consistent with disclosed embodiments of the present disclosure.

The present disclosure provides a display panel. FIG. 1 illustrates a schematic structural diagram of a display panel consistent with disclosed embodiments of the present disclosure. Referring to FIG. 1, the display panel may include a base substrate 10, and a first transistor 20 and a storage capacitor 30 disposed on the base substrate 10. The storage capacitor 30 may include a first electrode 31 and a second electrode 32 that are disposed opposite to each other. The first electrode 31 and a gate 20G of the first transistor 20 may have an overlapped region Q in a direction (e.g., F1 direction) perpendicular to a surface of the base substrate 10.

The display panel may also include a first insulating layer 40 disposed between the first electrode 31 and the gate 20G of the first transistor 20. The first insulating layer 40 may have a plurality of first vias 41 in the overlapped region Q. The first electrode 31 may be electrically connected to the gate 20G of the first transistor 20 through the plurality of first vias 41.

A plurality of grooves 31a may be disposed on a side of the first electrode 31 facing away from the base substrate 10, and a plurality of protrusions 32a may be disposed on a side of the second electrode 32 facing toward the base substrate 10. A groove 31a, a protrusion 32a, and a first via 41 may overlap in the direction (e.g., the F1 direction) perpendicular to the surface of the base substrate 10.

The reason that the groove 31a, the protrusion 32a, and the first via 41 overlap in the direction perpendicular to the surface of the base substrate 10 may include the following. When forming the first electrode 31 on a surface of the first insulating layer 40 having the plurality of first vias 41, because a thickness of the first electrode 31 is substantially thin in practical applications, a groove 31a may be formed in a region where a corresponding first via 41 is located on the side surface of the first electrode 31 facing away from the base substrate 10. The insulating layer between the first electrode 31 and the second electrode 32 may be referred to as a second insulating layer. In practical applications, a thickness of the second insulating layer may be substantially thin, such that a recess may be formed in a region where the groove 31a is located on a side surface of the second insulating layer facing away from the first electrode 31. In view of this, when forming the second electrode 32 on the second insulating layer, the protrusion 32a may be formed on the side surface of the second electrode 32 facing toward the base substrate 10. The protrusion 32a may overlap the groove 31a. Therefore, the groove 31a, the protrusion 32a, and the first via 41 may overlap in the direction perpendicular to the surface of the base substrate 10.

In practical applications, the display panel may include a plurality of pixels arranged in an array. Each pixel may include a pixel circuit and a light-emitting unit that are electrically connected to each other. The light-emitting unit may include an anode, a light-emitting layer, and a cathode. The anode may be electrically connected to the pixel circuit. Positive charges and negative charges may be inputted into the light-emitting layer through the anode and the cathode, respectively. The positive charges and negative charges may be combined in the light-emitting layer to generate power, and the generated power may excite a light-emitting material in the light-emitting layer to emit light, thereby achieving the display function of the display panel.

Figure 2:
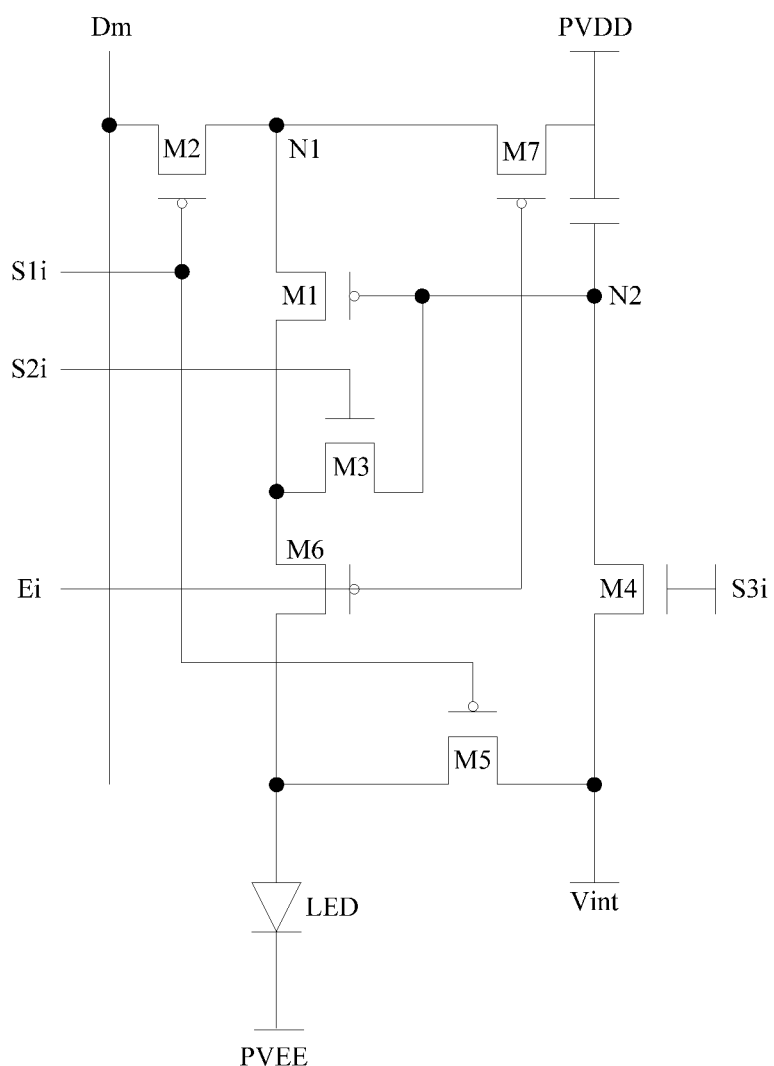
FIG. 2 illustrates a schematic structural diagram of an exemplary pixel circuit consistent with disclosed embodiments of the present disclosure.

FIG. 2 illustrates a schematic structural diagram of a pixel circuit consistent with disclosed embodiments of the present disclosure. Referring to FIG. 2, the pixel circuit may often include a plurality of switching transistors, a driving transistor M1, and a storage capacitor Cst. The structure of the pixel circuit is not limited to that illustrated in FIG. 2. One of the electrodes of the storage capacitor Cst may be electrically connected to a gate (i.e., a second node N2) of the driving transistor M1. The size of a capacitance value of the storage capacitor Cst may affect the charging efficiency of the storage capacitor Cst, and further may affect the working efficiency of the pixel circuit.

Therefore, in the disclosed embodiments of the present disclosure, by disposing the groove 31a, the protrusion 32a, and the first via 41, an area of overlapped region between the first electrode 31 and the second electrode 32, along a direction perpendicular to a surface of the first electrode 31 and/or a surface of the second electrode 32, in the storage capacitor may increase, the capacitance value of the storage capacitor may increase, and the charging efficiency of the storage capacitor may increase. Further, the working efficiency of the pixel circuit may be improved, and the performance of the pixel circuit may be improved.

In addition, by disposing the groove 31a, the protrusion 32a, and the first via 41, the storage capacitor may have desired bending resistance performance when being bent. Thus, the leakage current phenomenon of the storage capacitor may be prevented, and the flicker phenomenon caused by the leakage current may be eliminated, thereby improving the display effect of the display panel.

In one embodiment, the groove, the protrusion, and the first via may have a same cross-sectional shape on a plane parallel to the surface of the base substrate. The first electrode and the second insulating layer may often have a substantially thin thickness, therefore, the groove may be formed on the surface of the first electrode facing away from the base substrate, and the protrusion may be formed on the surface of the second electrode facing toward the base substrate. The groove, the protrusion, and the first via may overlap in the direction perpendicular to the surface of the base substrate. Thus, on the plane parallel to the surface of the base substrate, the cross-sectional shapes of the groove, the protrusion, and the first via may be same, while the cross-sectional shapes thereof may have slightly different dimensions.

Figure 3:
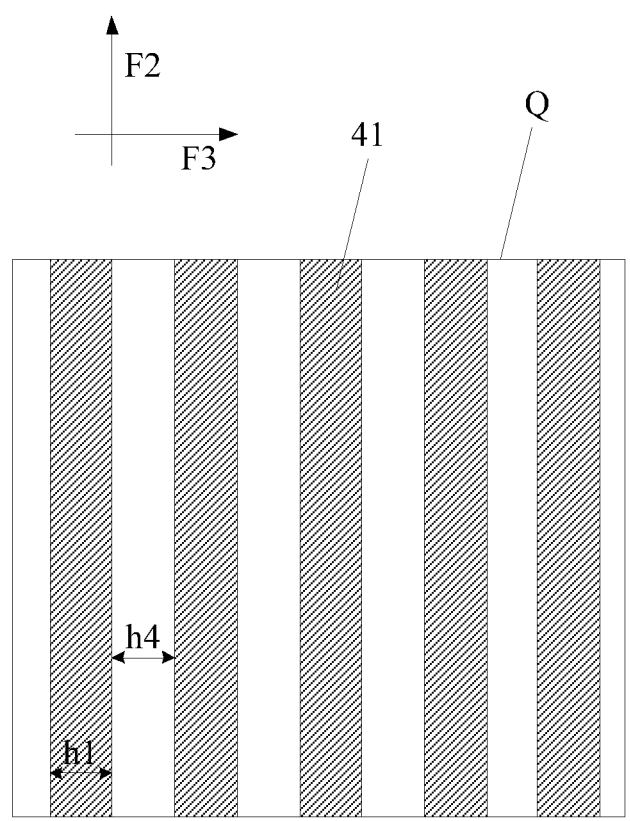
FIG. 3 illustrates a cross-sectional shape of an exemplary first via in an overlapped region on a plane parallel to a surface of a base substrate consistent with disclosed embodiments of the present disclosure.
Figure 4:
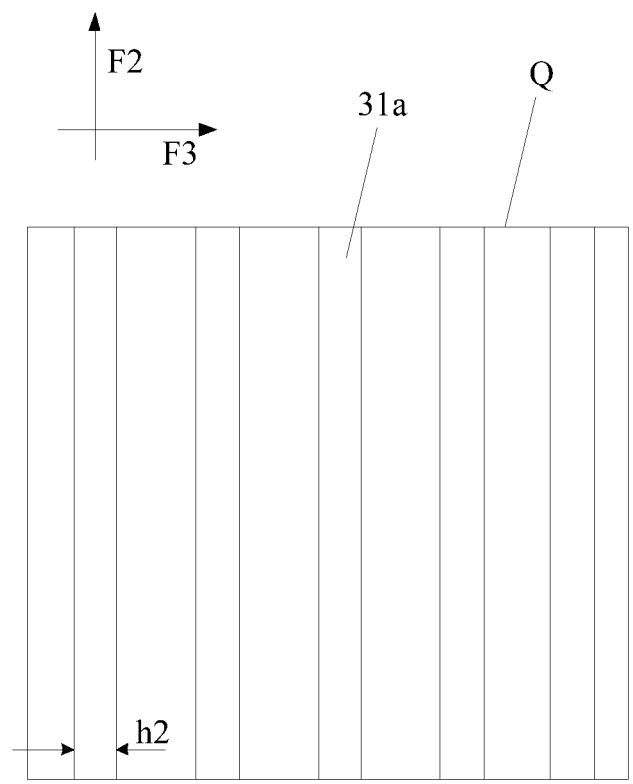
FIG. 4 illustrates a cross-sectional shape of an exemplary groove in an overlapped region on a plane parallel to a surface of a base substrate consistent with disclosed embodiments of the present disclosure.
Figure 5:
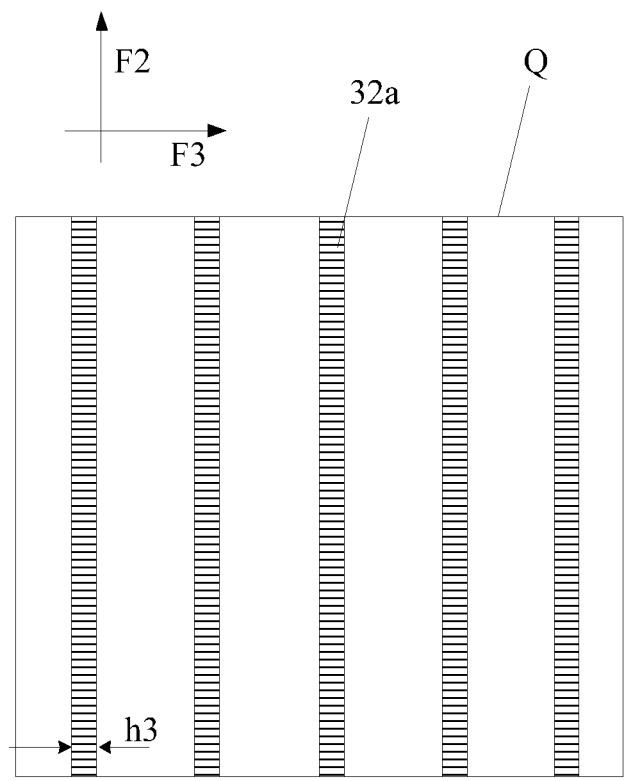
FIG. 5 illustrates a cross-sectional shape of an exemplary protrusion in an overlapped region on a plane parallel to a surface of a base substrate consistent with disclosed embodiments of the present disclosure.

FIG. 3 illustrates a cross-sectional shape of the first via 41 in the overlapped region on the plane parallel to the surface of the base substrate 10. FIG. 4 illustrates a cross-sectional shape of a groove 31a in the overlapped region on the plane parallel to the surface of the base substrate 10. FIG. 5 illustrates a cross-sectional shape of a protrusion 32a in the overlapped region on the plane parallel to the surface of the base substrate 10.

Referring to FIG. 3, the cross-sectional shape of the first via 41 may be a rectangle shape having a width h1. Referring to FIG. 4, the cross-sectional shape of the groove 31a may be a rectangle shape having a width h2. Referring to FIG. 5, the cross-sectional shape of the protrusion 32a may be a rectangle shape having a width h3, where h1>h2>h3. In other words, the cross-sectional shape of the first via 41 may have a largest size, the cross-sectional shape of the protrusion 32a may have a smallest size, and cross-sectional shape of the groove 31a may have a size in between.

In other words, due to the fabrication process and the thickness of each structure, the cross-sectional shapes of the groove, the protrusion, and the first via may be same, while the cross-sectional shapes thereof may have slightly different dimensions. In one embodiment, taking the first via as an example, disposing the cross-sectional shape of the first via on the plane parallel to the surface of the base substrate may include the following.

In one embodiment, the cross-sectional shape of the first via on the plane parallel to the surface of the base substrate may be a rectangle shape, a polygonal line shape, and a wavy line shape, etc. In view of this, the first vias may be extended along a first direction, and may be arranged along a second direction. The first direction may be different from the second direction, and the first direction and the second direction may be parallel to the surface of the base substrate.

In one embodiment, referring to FIG. 3, the cross-sectional shape of the first via 41 may be a rectangle shape. The first vias may be extended along a F2 direction, and may be arranged along a F3 direction. The F2 direction may be perpendicular to the F3 direction. The F3 direction may be referred to as a second direction, and the F2 direction may be referred to as a first direction. Similarly, referring to FIG. 4 and FIG. 5, the cross-sectional shape of the groove 31a may be a rectangle shape, and the cross-sectional shape of the protrusion 32a may be a rectangle shape. The grooves 31a may be extended along the F2 direction, and may be arranged along the F3 direction. The protrusions 32a may be extended along the F2 direction, and may be arranged along the F3 direction. The F2 direction may be perpendicular to the F3 direction.

Figure 6:
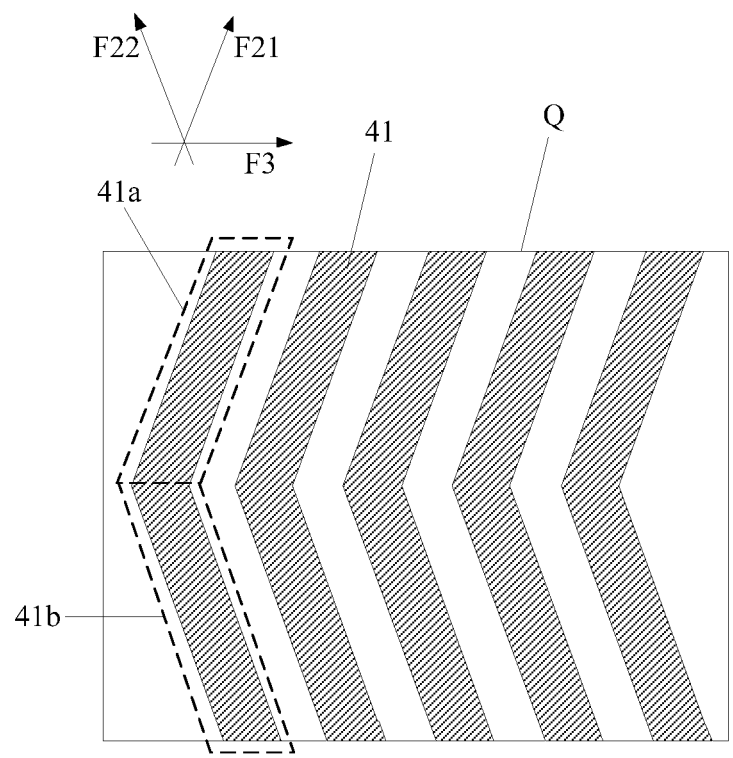
FIG. 6 illustrates a cross-sectional shape of another exemplary first via in an overlapped region on a plane parallel to a surface of a base substrate consistent with disclosed embodiments of the present disclosure.

FIG. 6 illustrates a cross-sectional shape of another first via 41 in the overlapped region Q on the plane parallel to the surface of the base substrate 10. In another embodiment, referring to FIG. 6, the cross-sectional shape of the first via 41 may be a polygonal shape. In view of this, the first via 41 may include a first sub-section 41a and a second sub-section 41b that are connected to each other. The first sub-section 41a may be extended along a first sub-direction F21, and the second sub-section 41b may be extended along a second sub-direction F22. The first vias 41 may be arranged along the F3 direction. Further, the F3 direction may be referred to as the aforementioned second direction, and the F21 direction and the F22 direction may be referred to as two sub-directions of the first direction.

In view of this, the disposure of the cross-sectional shape of the first via may facilitate improving the bending resistance of the storage capacitor and reducing the probability of leakage current of the storage capacitor. At the same time, the area of the overlapped region between the first electrode and the second electrode may greatly increase, thereby increasing the capacitance value of the storage capacitor, and improving the performance of the pixel circuit.

In one embodiment, if the display panel is bent along the F3 direction, the first vias may be arranged along the F3 direction. In other words, the bending direction of the display panel may have a same direction as the arrangement direction of each first via. Therefore, the bending resistance of the storage capacitor may greatly increase, thereby effectively improving the performance of the storage capacitor, greatly reducing the probability of leakage current of the storage capacitor, effectively avoiding the occurrence of flicker problem in a low-frequency display, and effectively improving the display effect.

Figure 7:
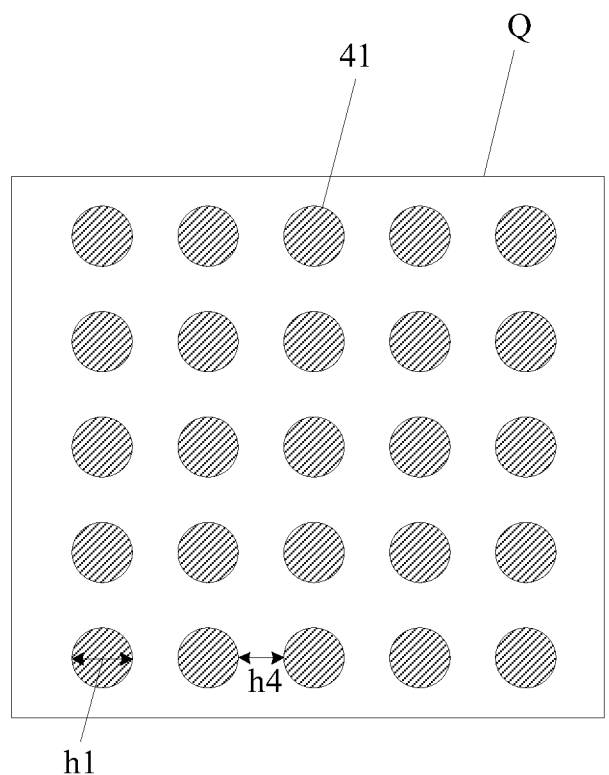
FIG. 7 illustrates a cross-sectional shape of another exemplary first via in an overlapped region on a plane parallel to a surface of a base substrate consistent with disclosed embodiments of the present disclosure.
Figure 8:
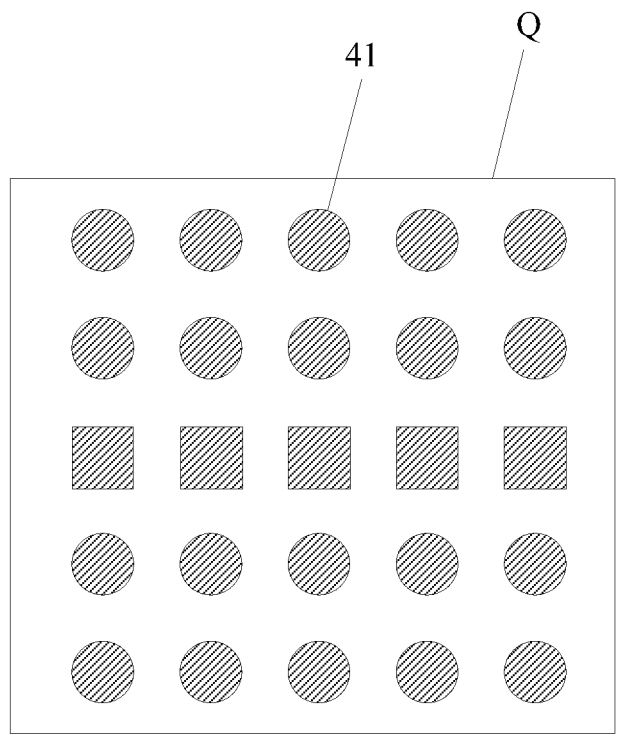
FIG. 8 illustrates a cross-sectional shape of another exemplary first via in an overlapped region on a plane parallel to a surface of a base substrate consistent with disclosed embodiments of the present disclosure.

In another embodiment, the first vias may be arranged in a matrix type. FIG. 7 illustrates a cross-sectional shape of another first via 41 in the overlapped region Q on the plane parallel to the surface of the base substrate 10. FIG. 8 illustrates a cross-sectional shape of another first via 41 in the overlapped region Q on the plane parallel to the surface of the base substrate 10.

Referring to FIG. 7 and FIG. 8, the first vias 41 may not penetrate through the overlapped region Q, and may be dispersedly disposed in the overlapped region Q. The cross-sectional shape of the first via 41 may not only be a circular shape, a square shape, but also be any other shape, e.g., a triangle shape, a polygon shape, and an ellipse shape, etc., which are not illustrated. The first vias 41 may be arranged in a matrix type.

In view of this, no matter in which direction the display panel is bent, the storage capacitor based on such structure may have a substantially high bending resistance, which is not limited by the bending direction, thereby greatly improving the application scope of such structure. The storage capacitor may have substantially high practicality.

In one embodiment, referring to FIG. 7, the cross-sectional shape of each first via 41 may have a same shape. In another embodiment, referring to FIG. 8, part of the first vias 41 may have a same cross-sectional shape, and another part of the first vias 41 may have a different cross-sectional shape, as long as the bending resistance of the storage capacitor can be improved and the capacitance value of the storage capacitor can increase, which is not limited herein.

In one embodiment, the disposure of the first via 41 may not be limited to the disclosed embodiments, as long as the bending resistance of the storage capacitor can be improved and the capacitance value of the storage capacitor can increase, which is not limited herein.

In one embodiment, the cross-sectional shape of the first via on the plane parallel to the surface of the base substrate may be a first shape. A minimum width of the first shape may be in a range of approximately 1 μm-3 μm.

In one embodiment, referring to FIG. 3 and FIG. 7, the cross-sectional shape of the first via 41 may be a rectangle shape. In view of this, the first shape may be a rectangle shape, and a minimum width of the corresponding rectangle shape is h1, where h1 may be in a range of approximately 1 μm-3 μm.

Referring to FIG. 7, the cross-sectional shape of the first via 41 may be a circular shape. In view of this, the first shape may be a circular shape, and a minimum width of the corresponding circular shape, i.e., a diameter of the circular shape, is h1, where h1 may be in a range of approximately 1 μm-3 μm.

The minimum width of the first shape may be in a range of approximately 1 μm-3 μm. If the minimum width of the first shape is less than 1 the size of the cross-sectional shape of the first via may be substantially small. In view of this, after forming the first electrode, the groove may not be formed on the side surface of the first electrode facing away from the base substrate, and, thus, the protrusion may not be formed on the side surface of the second electrode facing toward the base substrate. Therefore, the capacitance value of the storage capacitor may not increase, and the display panel on the basis of such structure may not improve the performance of the pixel circuit.

If the minimum width of the first shape is greater than 3 μm, the size of the first via may be substantially large. Because the first via is located in the first insulating layer, the fabrication process may include forming the first insulating layer, and forming the first via in the first insulating layer. In other words, the first via may be formed by etching the first insulating layer. If the size of the first via is substantially large, the etching difficulty may increase. In other words, the difficulty of the fabrication process may increase. At the same time, because the size of the first via is substantially large, if the accuracy control deviation occurs during the etching process, the gate of the first transistor may tend to be damaged. Therefore, the first transistor may fail to operate properly, and the operation of the pixel circuit may be affected, thereby ultimately causing a large amount of display defects.

Therefore, the minimum width of the first shape may be in a range of approximately 1 μm-3 μm. The difficulty of the fabrication process may be reduced, and the manufacturing yield of the display panel may be improved while improving the display effect of the display panel and improving the performance of the pixel circuit.

In one embodiment, referring to FIG. 3 and FIG. 7, a spacing h4 between adjacent two first vias 41 may be in a range of approximately 3 μm-7 μm. In view of this, during the manufacturing process, the first vias 41 may be spaced apart by a spacing, and, thus, the limitation of the manufacturing process may not cause connection between adjacent first vias 41. Furthermore, when the display panel is bent, the storage capacitor may have desired bending resistance to a certain extent, which may facilitate improving the display effect and reliability of the display panel.

In one embodiment, referring to FIG. 1, the display panel may further include a second insulating layer 50 disposed between the first electrode 31 and the second electrode 32. The first insulating layer 40 may have a first density, and the second insulating layer 50 may have a second density. The first density may be smaller than the second density.

The first insulating layer may include, but is not limited to, silicon nitride. Because the first density of the first insulating layer is substantially small, there may be a large spacing between the nitrogen element and the silicon element in the first insulating layer. The arrangement of elements in the first insulating layer may be substantially loose.

The second insulating layer may include, but is not limited to, silicon nitride. Because the second density of the second insulating layer is substantially large, there may be a small spacing between the nitrogen element and the silicon element in the second insulating layer. The arrangement of elements in the second insulating layer may be substantially dense.

In the prior art, the storage capacitor is formed by the gate of the first transistor and the first electrode in FIG. 1. Because the elements in the first insulating layer are arranged loosely, when being bent, the first insulating layer has poor insulation performance, and the leakage current of the storage capacitor easily occurs. If the first transistor is the driving transistor M1 in FIG. 2, the leakage current of the storage capacitor adversely affects the driving transistor, and then affects the magnitude of current flowing through the LED. In a low-frequency display, because a period of one frame is substantially long, and the refresh is substantially slow, the flicker problem is obvious.

In the disclosed display panel, when being bent, the elements in the second insulating layer may be arranged closely, such that the second insulating layer may still have substantially strong insulation performance. Leakage current of the storage capacitor may be prevented, thereby avoiding adverse effects on the driving transistor, and avoiding the impacts on the current flowing through the LED. Thus, even in a low-frequency display, the flicker problem may be effectively eliminated, and the display effect may be improved.

In one embodiment, the first insulating layer may have a thickness greater than the second insulating layer. In view of this, by making a substantially thin second insulating layer, the rigidity of the second insulating layer may be reduced. Therefore, when being bent, damages on the second insulating layer may be reduced, and leakage current of the storage capacitor may be avoided.

In addition, the substantially thin second insulating layer may enable the height of the protrusion (the height of the protrusion may refer to a length of the protrusion along the F1 direction as illustrated in FIG. 1) formed on the side of the second electrode facing toward the base substrate to be substantially large. Thus, the area of the overlapped region between the first electrode and the second electrode may be substantially large, thereby increasing the capacitance value of the storage capacitor, and improving the performance of the pixel circuit.

In one embodiment, the first insulating layer may have a thickness in a range of approximately 300 nm-800 nm. The second insulating layer may have a thickness in a range of approximately 100 nm-200 nm.

In certain embodiments, the thickness of the first insulating layer and the thickness of the second insulating layer may be set in any other suitable range, as long as being capable of increasing the capacitance value of the storage capacitor and avoiding leakage current of the storage capacitor, which may be determined according to practical applications to meet the needs of various application scenarios and to improve design flexibility.

The display panel may include a plurality of pixels, and each pixel may include a pixel circuit. Therefore, the storage capacitor in each pixel may adopt the above-disclosed disposure method to enable the display panel to have a desired display effect.

In one embodiment, the display panel may further include a function layer and a planarization layer that are sequentially disposed on a side of the storage capacitor facing away from the base substrate. The disposure of the function layer may include the following.

Figure 9:
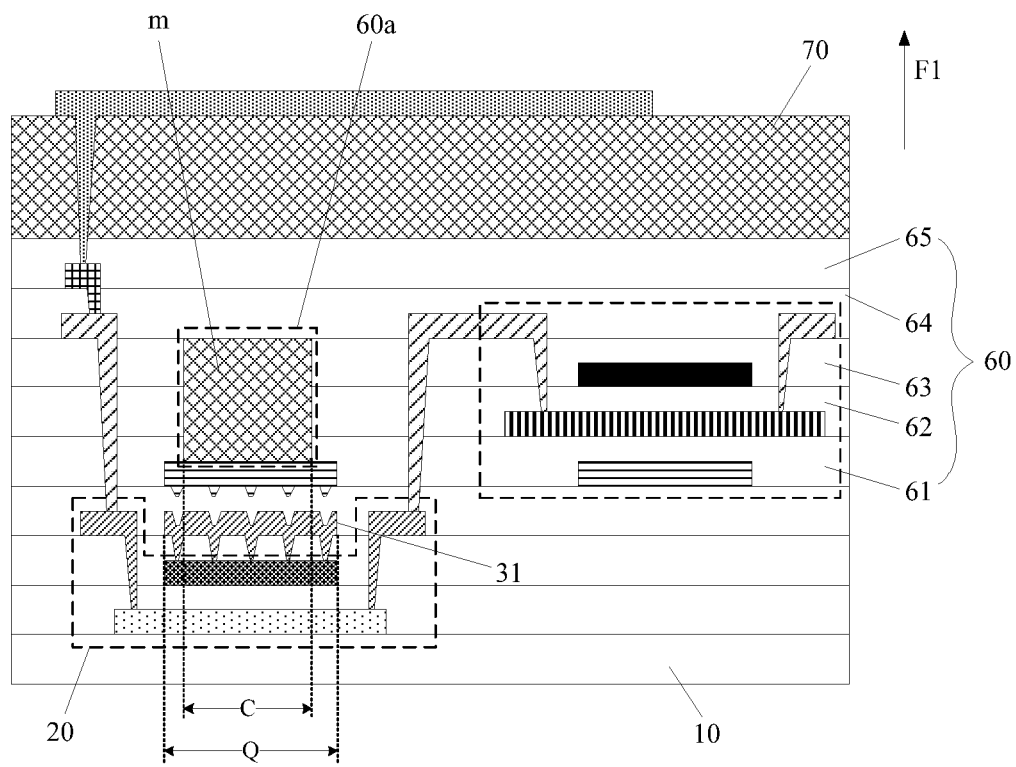
FIG. 9 illustrates a schematic structural diagram of another exemplary display panel consistent with disclosed embodiments of the present disclosure.

FIG. 9 illustrates a schematic structural diagram of another display panel. In one embodiment, referring to FIG. 9, a recess 60a may be formed on a side of the function layer facing toward the base substrate 10. The recess 60a may overlap the overlapped region Q in a direction (e.g., the F1 direction) perpendicular to the surface of the base substrate 10. An organic film structure m may be formed in the recess 60a.

In view of this, a partial structure on the storage capacitor may be an organic film structure. The organic film structure may increase the bending resistance of the overlapped region to a certain extent, and may improve the bending resistance of the storage capacitor, thereby avoiding leakage current of the storage capacitor, and improving the display effect of the display panel.

In one embodiment, the organic film structure may not be in direct contact with the planarization layer 70, but the organic film structure may still be made of a same material as the planarization layer 70. Referring to FIG. 9, a filling pattern of the inner structure of the recess 60a being the same as a filling pattern of the planarization layer 70 may refer to that the filling pattern of the inner structure of the recess 60a is made of a same material as the filling pattern of the planarization layer 70.

Because the recess is formed by an etching process, a depth of the recess may be substantially small, which may reduce the difficulty for forming the recess, thereby reducing the difficulty for forming the display panel, and improving the production efficiency of the display panel.

In one embodiment, the function layer may include a plurality of inorganic film layers. Referring to FIG. 9, the function layer may include a first inorganic film layer 61, a second inorganic film layer 62, a third inorganic film layer 63, a fourth inorganic film layer 64 and a fifth inorganic film layer 65. In view of this, the recess may be disposed in the first inorganic film layer 61, the second inorganic film layer 62, and the third inorganic film layer 63. The disposure location of the recess may not be limited to that illustrated in FIG. 9, and may be any other location of the film layers in the function layer, which is not limited herein.

In one embodiment, the overlapped region may fall into the region where the recess is located. In other words, the overlapped region may have a same area as the region where the recess is located, which is not illustrated. In another embodiment, referring to FIG. 9, the overlapped region Q may have an area larger than the region C where the recess is located. The area of the overlapped region and the area of the region where the recess is located may be set according to practical applications, to meet the requirements of various application scenarios and improve design flexibility.

Figure 10:
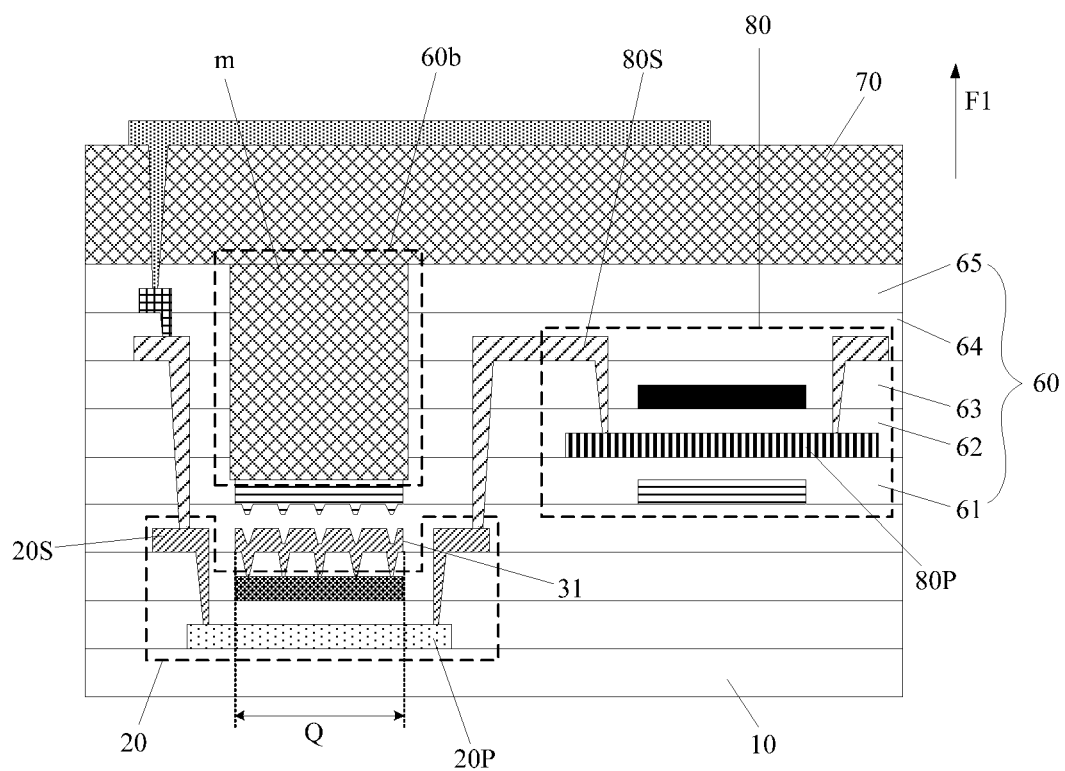
FIG. 10 illustrates a schematic structural diagram of another exemplary display panel consistent with disclosed embodiments of the present disclosure.

FIG. 10 illustrates a schematic structural diagram of another display panel. In another embodiment, referring to FIG. 10, the function layer 60 may include a second via 60b. The second via 60b may overlap the overlapped region Q in the direction (e.g., the F1 direction) perpendicular to the surface of the base substrate 10. The organic film structure m may be disposed in the second via 60b.

In view of this, the structure on the storage capacitor may be an organic film structure. The organic film structure may greatly increase the bending resistance of the overlapped region, and may improve the bending resistance of the storage capacitor, thereby avoiding leakage current of the storage capacitor, and improving the display effect of the display panel.

In one embodiment, referring to FIG. 10, the organic film structure m may be in direct contact with the planarization layer 70, and the organic film structure m may be made of a same material as the planarization layer 70. In other words, the organic film structure and the planarization layer may be formed by a same process, which may reduce the steps of the fabrication process, may reduce the difficulty of the fabrication process, and may improve the bending resistance of the storage capacitor.

In one embodiment, the function layer may include a plurality of inorganic film layers. Referring to FIG. 10, the function layer may include a first inorganic film layer 61, a second inorganic film layer 62, a third inorganic film layer 63, a fourth inorganic film layer 64 and a fifth inorganic film layer 65. The second via may penetrate through each inorganic film layer in the function layer, such that the storage capacitor may have a substantially great bending resistance, thereby greatly improving the display effect of the display panel.

In one embodiment, the overlapped region may fall into the region where the second via is located. In other words, referring to FIG. 10, the overlapped region may have a same area as the region where the second via is located. In another embodiment, the overlapped region may have an area larger than the region where the second via is located, which is not illustrated. The area of the overlapped region and the area of the region where the second via is located may be set according to practical applications, to meet the requirements of various application scenarios and to improve design flexibility.

Each inorganic film layer included in the function layer may be an insulating film layer, and each inorganic film layer may be made of a same or different material, which is not limited by the present disclosure. The structures in each film layer may be prevented from interfering each other, and each structure may be ensured to operate normally.

In practical applications, referring to FIG. 2, the pixel circuit may include, but is not limited to, seven transistors. Transistors M1, M2, M5, M6, and M7 may be a P-type transistor, and transistors M3 and M4 may be an N-type transistor. The P-type transistor may be made of a low-temperature polysilicon material, and the N-type transistor may be made of transparent metal oxide (e.g., indium gallium zinc oxide (IGZO)).

Because the pixel circuit includes two types of transistors, when being formed, the two types of transistors may be disposed in different layers. Referring to FIG. 10, when the display panel further includes a second transistor 80, the first transistor 20 and the second transistor 80 may be two types of transistors. The second transistor 80 may be disposed on the side of the first electrode 31 facing away from the base substrate 10. The source 80S/drain of the second transistor 80 and the source 20S/drain of the first transistor 20 may be disposed in different layers.

In the disclosed embodiments, the second transistor may be disposed on the side of the first electrode facing away from the base substrate, and the first transistor may be disposed between the second electrode and the base substrate, such that the display panel may desire to be provided with a substantially amount of film layers. However, by disposing the first vias, even comprising a substantially amount of film layers, the storage capacitor may still have a desired bending resistance. Therefore, the flicker problem caused by the leakage current of the storage capacitor may be prevented, thereby improving the display effect of the display panel.

In one embodiment, referring to FIG. 10, the first transistor 20 may be a P-type transistor, and correspondingly, an active layer 20P of the first transistor 20 may be made of polysilicon. The second transistor 80 may be an N-type transistor, and correspondingly, an active layer 80P of the second transistor 80 may be made of indium gallium zinc oxide.

The first transistor may be disposed on a side of the second transistor facing toward the base substrate. A temperature required for forming the second transistor may be substantially low. If the temperature is too high, the performance of the second transistor may be affected. A temperature required for forming the first transistor may be higher than the temperature required for forming the second transistor. After forming the first transistor at a substantially high temperature, the second transistor may be formed. Therefore, the second transistor may be prevented from being affected by the high temperature, and at the same time, it may be ensured that the first transistor and the second transistor have a substantially high production yield, thereby ensuring that the display panel has a substantially high reliability.

Figure 11:
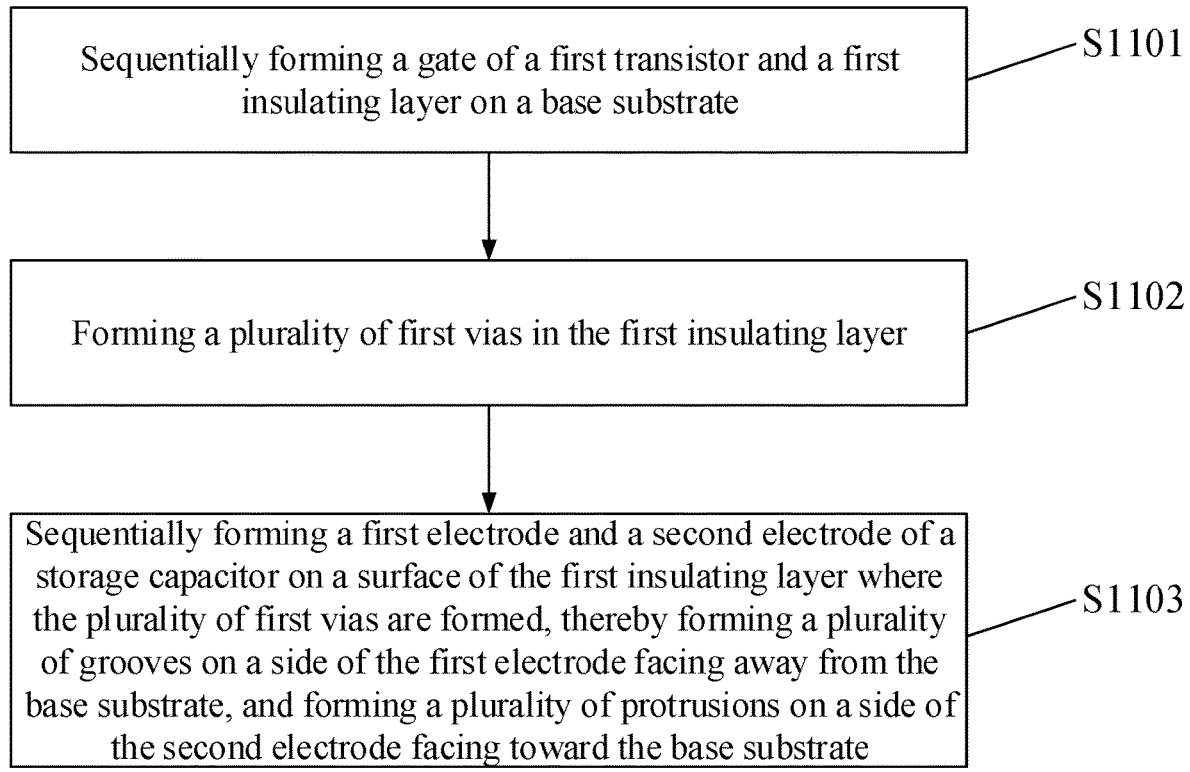
FIG. 11 illustrates a flow chart of an exemplary fabrication method of a display panel consistent with disclosed embodiments of the present disclosure.

The present disclosure also provides a fabrication method of a display panel. FIG. 11 illustrates a flow chart of a fabrication method of the display panel. The display panel may be a display panel in any one of the above-disclosed embodiments. The fabrication method may include the following.

S1101: Sequentially forming a gate of a first transistor and a first insulating layer on a base substrate.

S1102: Forming a plurality of first vias in the first insulating layer.

S1103: Sequentially forming a first electrode and a second electrode of a storage capacitor on a surface of the first insulating layer where the plurality of first vias are formed, thereby forming a plurality of grooves on a side of the first electrode facing away from the base substrate, and forming a plurality of protrusions on a side of the second electrode facing toward the base substrate.

The first electrode and the gate of the first transistor may have an overlapped region in a direction perpendicular to the surface of the base substrate. The first vias may be disposed in the overlapped region. The first electrode may be electrically connected to the gate of the first transistor through the plurality of first vias. The groove, the protrusion, and the first via may overlap in the direction perpendicular to the surface of the base substrate.

In one embodiment, the display panel formed by the above-disclosed method may be featured with following advantages. An area of the overlapped region between the first electrode and the second electrode in the storage capacitor may increase, the capacitance value of the storage capacitor may increase, and the performance of the pixel circuit may increase.

By disposing the grooves, protrusions, and first vias, when being bent, the storage capacitor may have a desired bending resistance, and a leakage current phenomenon of the storage capacitor may be prevented, thereby eliminating flicker problem caused by the leakage current, and improving the display effect of the display panel.

The disposure of the first via, on the one hand, may achieve the electrical connection between the first electrode and the gate of the first transistor, and on the other hand, may naturally form grooves when the first electrode covers the first vias, which may facilitate simplifying the process.

In one embodiment, the method may further include: forming a function layer on the surface of the second electrode; forming a second via in the function layer, where the second via may overlap the overlapped region in the direction perpendicular to the surface of the base substrate; filling an organic film structure in the second via; and forming a planarization layer on the surface of the function layer filled with the organic film structure.

In view of this, the structure on the storage capacitor may be an organic film structure. The organic film structure may greatly increase the bending resistance of the overlapped region, and may improve the bending resistance of the storage capacitor, thereby avoiding leakage current of the storage capacitor, and improving the display effect of the display panel.

In one embodiment, the organic film structure may be made of a material different from the planarization layer. In another embodiment, the organic film structure may be made of a same material as the planarization layer.

In view of this, in the disclosed embodiments, the corresponding fabrication method may include: forming a function layer on the surface of the second electrode; forming a second via in the function layer, where the second via may overlap the overlapped region in the direction perpendicular to the surface of the base substrate; and forming a planarization layer on the function layer, where the planarization layer may fill the second via.

In view of this, the organic film structure and the planarization layer may be formed by a same process, which may reduce the steps of the fabrication process, and may reduce the difficulty of the fabrication process. Further, the bending resistance of the storage capacitor may be improved.

Figure 12:
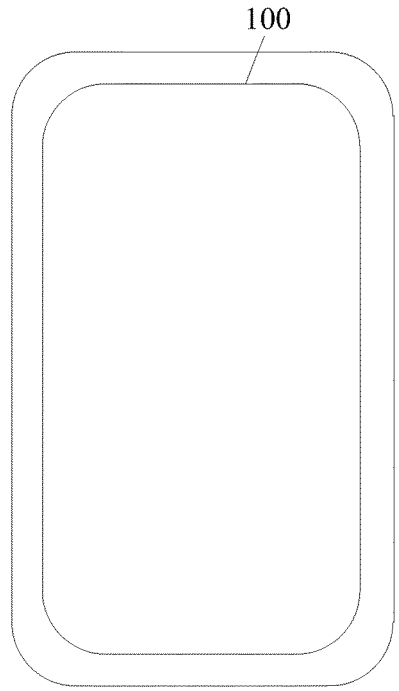
FIG. 12 illustrates a schematic structural diagram of an exemplary display device consistent with disclosed embodiments of the present disclosure.

The present disclosure also provides a display device. FIG. 12 illustrates a schematic structural diagram of a display device. Referring to FIG. 12, the display device may include a display panel 100 in any one of the disclosed embodiments. In one embodiment, the display panel may be an electroluminescent display panel.

In one embodiment, the display device may be any product or component having a display function, e.g., a mobile phone (as illustrated in FIG. 12), a tablet computer, a television, a display, a notebook computer, a digital photo frame, and a navigator, etc. The implementation of the display device may refer to the above-disclosed embodiments of the display panel, which is not repeated herein.

The present disclosure provides a display panel and fabrication method, and a display device. A plurality of first vias may be disposed in the overlapped region in the first insulating layer disposed between the first electrode and the gate of the first transistor. A plurality of grooves may be formed on the side of the first electrode facing away from the base substrate. A plurality of protrusions may be formed on the side of the second electrode facing toward the base substrate. The groove, the protrusion, and the first via may overlap in the direction perpendicular to the surface of the base substrate. On the one hand, the area of the overlapped region between the first electrode and the second electrode may greatly increase, thereby increasing the capacitance value of the storage capacitor, and improving the performance of the pixel circuit. On the other hand, by disposing the grooves, protrusions, and first vias, when being bent, the storage capacitor may have a desired bending resistance, and a leakage current phenomenon of the storage capacitor may be prevented, thereby eliminating flicker problem caused by the leakage current, and improving the display effect of the display panel.

The description of the disclosed embodiments is provided to illustrate the present disclosure to those skilled in the art. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments illustrated herein but is to be accorded the widest scope consistent with the principles and novel features disclosed herein.

What is claimed is:

1. A display panel, comprising:
   a base substrate;
   a first transistor and a storage capacitor disposed on the base substrate, wherein the storage capacitor includes a first electrode and a second electrode that are disposed opposite to each other, and the first electrode and a gate of the first transistor have an overlapped region in a direction perpendicular to a surface of the base substrate; and
   a first insulating layer disposed between the first electrode and the gate of the first transistor, wherein the first insulating layer has a plurality of first vias in the overlapped region, and the first electrode is electrically connected to the gate of the first transistor through the plurality of first vias, wherein:
   the first electrode includes a first side and a second side that are opposite to each other, and the first side is a side of the first electrode facing away from the base substrate,
   a plurality of grooves are formed on the first side of the first electrode,
   a plurality of protrusions are formed on a side of the second electrode facing toward the base substrate, and
   a groove of the plurality of grooves, a protrusion of the plurality of protrusions, and a first via of the plurality of first vias overlap in the direction perpendicular to the surface of the base substrate.

2. The display panel according to claim 1, wherein:
   the groove, the protrusion, and the first via have a same cross-sectional shape on a plane parallel to the surface of the base substrate.

3. The display panel according to claim 2, wherein:
   the plurality of first vias are extended along a first direction, and are arranged along a second direction, wherein the first direction is different from the second direction, and the first direction and the second direction are parallel to the surface of the base substrate.

4. The display panel according to claim 2, wherein:
   the first vias are arranged in a matrix.

5. The display panel according to claim 1, wherein:
   a cross-sectional shape of the first via on the plane parallel to the surface of the base substrate is a first shape, and a minimum width of the first shape is in a range of approximately 1-3 μm.

6. The display panel according to claim 1, wherein:
   a spacing between adjacent two first vias is in a range of approximately 3 μm-7 μm.

7. The display panel according to claim 1, further including:
   a second insulating layer disposed between the first electrode and the second electrode, wherein the first insulating layer has a first density, the second insulating layer has a second density, and the first density is smaller than the second density.

8. The display panel according to claim 7, wherein:
   the first insulating layer has a thickness larger than the second insulating layer.

9. The display panel according to claim 8, wherein:
   the first insulating layer has a thickness in a range of approximately 300 nm-800 nm; and
   the second insulating layer has a thickness in a range of approximately 100 nm-200 nm.

10. The display panel according to claim 1, further including:
    a function layer and a planarization layer that are sequentially disposed on a side of the storage capacitor facing away from the base substrate, wherein:
    the function layer includes a second via, the second via overlaps the overlapped region in the direction perpendicular to the surface of the base substrate, and an organic film structure is disposed in the second via.

11. The display panel according to claim 10, wherein:
    the organic film structure is in direct contact with the planarization layer, and the organic film structure is made of a same material as the planarization layer.

12. The display panel according to claim 10, wherein:
    the overlapped region falls in a region where the second via is located.

13. The display panel according to claim 10, wherein:
    the function layer includes a plurality of inorganic film layers.

14. The display panel according to claim 1, further including:
    a second transistor, wherein:
    the second transistor is disposed on the first side of the first electrode, and
    a source/drain electrode of the second transistor is disposed in a layer different from a source/drain electrode of the first transistor.

15. The display panel according to claim 14, wherein:
    an active layer of the first transistor is made of polysilicon; and
    an active layer of the second transistor is made of indium gallium zinc oxide.

16. A display device, comprising a display panel, wherein the display panel includes:
    a base substrate;
    a first transistor and a storage capacitor disposed on the base substrate, wherein the storage capacitor includes a first electrode and a second electrode that are disposed opposite to each other, and the first electrode and a gate of the first transistor have an overlapped region in a direction perpendicular to a surface of the base substrate; and
    a first insulating layer disposed between the first electrode and the gate of the first transistor, wherein the first insulating layer has a plurality of first vias in the overlapped region, and the first electrode is electrically connected to the gate of the first transistor through the plurality of first vias, wherein:

the first electrode includes a first side and a second side that are opposite to each other, and the first side is a side of the first electrode facing away from the base substrate, a plurality of grooves are formed on the first side of the first electrode, a plurality of protrusions are formed on a side of the second electrode facing toward the base substrate, and a groove of the plurality of grooves, a protrusion of the plurality of protrusions, and a first via of the plurality of first vias overlap in the direction perpendicular to the surface of the base substrate.

* * * * *